United States Patent
Palani et al.

(10) Patent No.: US 12,261,596 B1
(45) Date of Patent: Mar. 25, 2025

(54) SYSTEMS AND METHODS FOR LOW TEMPERATURE COEFFICIENT CAPACITORS

(71) Applicant: Mixed-Signal Devices Inc., Irvine, CA (US)

(72) Inventors: Rakesh Kumar Palani, New Delhi (IN); Shouri Chatterjee, New Delhi (IN); Sweta Agarwal, New Delhi (IN); Srikar Bhagavatula, Irvine, CA (US)

(73) Assignee: Mixed-Signal Devices Inc., Irvine, CA (US)

( * ) Notice: Subject to any disclaimer, the term of this patent is extended or adjusted under 35 U.S.C. 154(b) by 781 days.

(21) Appl. No.: 17/472,069

(22) Filed: Sep. 10, 2021

Related U.S. Application Data

(60) Provisional application No. 63/077,430, filed on Sep. 11, 2020.

(51) Int. Cl.
   *H03K 17/14* (2006.01)

(52) U.S. Cl.
   CPC .................................. *H03K 17/145* (2013.01)

(58) Field of Classification Search
   CPC .................................................... H03K 17/145
   USPC ............. 331/177 V, 179, 176, 36 C; 334/15; 361/277
   See application file for complete search history.

(56) References Cited

U.S. PATENT DOCUMENTS

| | | |
|---|---|---|
| 5,231,316 A | 7/1993 | Thelen, Jr. |
| 10,473,530 B2 | 11/2019 | Fan et al. |
| 11,043,936 B1 * | 6/2021 | Wu .......................... H03K 3/011 |
| 11,469,761 B1 | 10/2022 | Palani et al. |
| 11,641,189 B2 * | 5/2023 | Wu .......................... H01L 29/94 331/111 |
| 2002/0122285 A1 | 9/2002 | Aoki et al. |
| 2003/0137357 A1 | 7/2003 | Ye et al. |
| 2004/0189417 A1 | 9/2004 | Fujita |
| 2006/0262623 A1 | 11/2006 | Sutardja |

(Continued)

FOREIGN PATENT DOCUMENTS

| | | |
|---|---|---|
| CN | 103412606 A | 11/2013 |
| CN | 104375551 A | 2/2015 |

(Continued)

OTHER PUBLICATIONS

Choi et al., "A 110 nW Resistive Frequency Locked On-Chip Oscillator with 34.3 ppm/° C. Temperature Stability for System-on-Chip Designs", IEEE Journal of Solid-State Circuits, vol. 51, No. 9, Sep. 2016, pp. 2106-2118.

(Continued)

*Primary Examiner* — Arnold M Kinkead
(74) *Attorney, Agent, or Firm* — KPPB LLP

(57) ABSTRACT

Low temperature coefficient capacitors are described. In an embodiment, a capacitor includes several metal-oxide-semiconductor (MOS) transistors, where each of the several MOS transistors includes a gate, a source and a drain terminal, and where the source and drain terminals of each of the several MOS transistors are connected; several switches, where each of the switches includes two terminals; where first terminals of each of the switches from the several switches are connected together; and where a second terminal of each of the switches from the several switches is connected to a gate terminal of each of the several MOS transistors.

19 Claims, 3 Drawing Sheets

(56) References Cited

U.S. PATENT DOCUMENTS

| | | | |
|---|---|---|---|
| 2009/0322416 | A1 | 12/2009 | Yuasa |
| 2010/0271144 | A1 | 10/2010 | Mccorquodale et al. |
| 2011/0128080 | A1 | 6/2011 | Wennekers et al. |
| 2011/0267150 | A1 | 11/2011 | Fan et al. |
| 2011/0316595 | A1 | 12/2011 | Bolton |
| 2012/0098045 | A1 | 4/2012 | Tian et al. |
| 2013/0113533 | A1 | 5/2013 | Aaltonen et al. |
| 2014/0247095 | A1 | 9/2014 | Edwards et al. |
| 2015/0346746 | A1 | 12/2015 | Huang et al. |
| 2016/0164529 | A1 | 6/2016 | Nakamura et al. |

FOREIGN PATENT DOCUMENTS

| | | |
|---|---|---|
| CN | 106909194 A | 6/2017 |
| DE | 102016113283 A1 | 1/2018 |

OTHER PUBLICATIONS

Choi et al., "A 99nW 70.4kHz Resistive Frequency Locking On-Chip Oscillator with 27.4ppm/° C. Temperature Stability", Symposium on VLSI Circuits (VLSI Circuits), Kyoto, Japan, Jun. 17-19, 2015, pp. C238-C239.

Gürleyük et al., "A CMOS Dual-RC Frequency Reference With ±200-ppm Inaccuracy From −45° C. to 85° C.", IEEE Journal of Solid-State Circuits, vol. 53, No. 12, Dec. 2018, 10 pgs.

Liu et al., "A 2.5 ppm/° C. 1.05-MHz Relaxation Oscillator With Dynamic Frequency-Error Compensation and Fast Start-Up Time", IEEE Journal of Solid-State Circuits, vol. 54, No. 7, Jul. 2019, First Published: May 3, 2019, pp. 1952-1959, DOI: 10.1109/JSSC.2019.2911208.

Long, "Phase Locked Loop Circuits", UCSB/ECE Department, Apr. 27, 2005, 46 pgs.

Razavi, "Challenges in the Design High-Speed Clock and Data Recovery Circuits", IEEE Communications Magazine, vol. 40, No. 8, Aug. 2002, pp. 94-101.

Zhang et al., "A 3.2 ppm/° C. Second-Order Temperature Compensated CMOS On-Chip Oscillator Using Voltage Ratio Adjusting Technique", IEEE Journal of Solid-State Circuits, vol. 53, No. 4, Apr. 2018, First Published: Dec. 4, 2017, pp. 1184-1191, DOI: 10.1109/JSSC.2017.2772808.

\* cited by examiner

SYSTEMS AND METHODS FOR LOW TEMPERATURE COEFFICIENT CAPACITORS

CROSS-REFERENCE TO RELATED APPLICATIONS

This application claims priority to U.S. Provisional Application No. 63/077,430 entitled "Low Temperature Coefficient Capacitor" to Palani et al., filed Sep. 11, 2020, the disclosure of which is herein incorporated by reference in its entirety.

FIELD OF THE INVENTION

The present invention generally relates to electronic capacitors and, more specifically, to low temperature coefficient capacitors.

BACKGROUND

Electronic capacitors may operate over a range of temperatures. It may be desirable to provide a capacitor which exhibits substantially constant capacitance over an operational temperature range. Low temperature coefficient capacitors can be employed in analog, mixed-signal and RF applications. A capacitor is considered to have a low temperature coefficient when the value of the temperature coefficient is below approximately 10-20 parts per million (ppm) per degree Celsius (ppm/° C.).

SUMMARY OF THE INVENTION

Systems and methods for providing temperature coefficient capacitors in accordance with various embodiments of the invention are illustrated In an embodiment, a capacitor includes several metal-oxide-semiconductor (MOS) transistors, where each of the several MOS transistors includes a gate, a source and a drain terminal, and where the source and drain terminals of each of the several MOS transistors are connected; several switches, where each of the switches includes two terminals; where first terminals of each of the switches from the several switches are connected together; and where a second terminal of each of the switches from the several switches is connected to a gate terminal of each of the several MOS transistors.

In a further embodiment, a signal generated by a voltage-controlled oscillator (VCO) is utilized to drive a first switch from the several switches, while an inverse of the signal, generated by an inverter circuit, is utilized to drive a second switch from the several switches.

In a further embodiment again, the several MOS transistors and the several switches are configured, in combination, to simulate a capacitor that is stable with temperature variations.

In a further embodiment still, each of the gates of the several MOS transistors is connected to a power supply through a respective switch from the several switches.

In still a further embodiment, the source and drain terminals of the several MOS transistors are connected to a ground node.

In still a further embodiment again, the several switches are turned on/off interchangeably at a frequency f.

In still a further embodiment again, one of the MOS transistors from the several MOS transistors is connected between the power supply and ground at any one time.

In still a further embodiment again, the several switches are sized such that they do not add to the temperature coefficient of the overall circuit.

In still yet a further embodiment again, the capacitor is utilized within a frequency reference circuit.

In still a further embodiment again, the capacitor is utilized within an analog sub-circuit.

In still a further embodiment still, the capacitor further includes at least two MOS capacitors that are commuted on/off to reduce a ripple in a voltage across the gate to source/drain of the MOS capacitors.

DETAILED DESCRIPTION OF THE DRAWINGS

Turning now to the drawings, low temperature coefficient capacitors in accordance with various embodiments of the invention are illustrated. In numerous embodiments, a MOS transistor can be configured to simulate a capacitor, where the MOS transistor includes a gate terminal, a source terminal and a drain terminal, and where the source and drain terminals are connected. In this way, the MOS transistor can have two terminals act as a capacitor. Further, the MOS transistor can be biased in the accumulation region of its operation. In several embodiments, a low temperature coefficient capacitor can be utilized within a switched resistor (switched-R) circuit. A switched-R circuit is described in the disclosure of U.S. Provisional Patent Application Ser. No. 63/077,420, entitled titled "A CMOS Frequency Reference Circuit with Temperature Coefficient Cancellation", filed on Sep. 11, 2020, which is hereby incorporated by reference herein in its entirety. In various embodiments, a low temperature coefficient capacitor can have two MOS capacitors which can be commuted on/off to reduce a ripple in a voltage across the gate to source/drain of the MOS capacitor. In certain embodiments, commuting switches can be sized such that the commuting switches themselves do not (or do not significantly) add to the temperature coefficient of the capacitor. In certain embodiments, a signal generated by a voltage-controlled oscillator (VCO) can be utilized to drive one switch, while an inverse of the signal, generated by an inverter circuit, can be utilized to drive the other switch.

In many embodiments, a low temperature coefficient capacitor can include two or more MOS transistors, where a source and a drain terminal of each of the MOS transistors are connected, and two or more switches, where the MOS transistors and the switches are configured, in combination, to simulate a capacitor which is stable with temperature variations.

Existing CMOS process technologies utilize metal-on-metal (MOM) capacitors, which can have a high temperature coefficient, for example 73 ppm/° C. This can make these MOM capacitors impractical for use in precision analog circuitry. In many embodiments, a low temperature coefficient capacitor implemented using MOS capacitors can provide a low temperature coefficient, for example 8.25 ppm/° C. for a voltage swing across the MOS capacitor of 100 mV. Note that the specific value for temperature coefficient can vary depending upon the low temperature coefficient capacitor and the requirements of specific applications.

Various low temperature coefficient capacitors and their applications in accordance with certain embodiments of the invention are discussed further below.

Low Temperature Coefficient Capacitors

Figure 1:
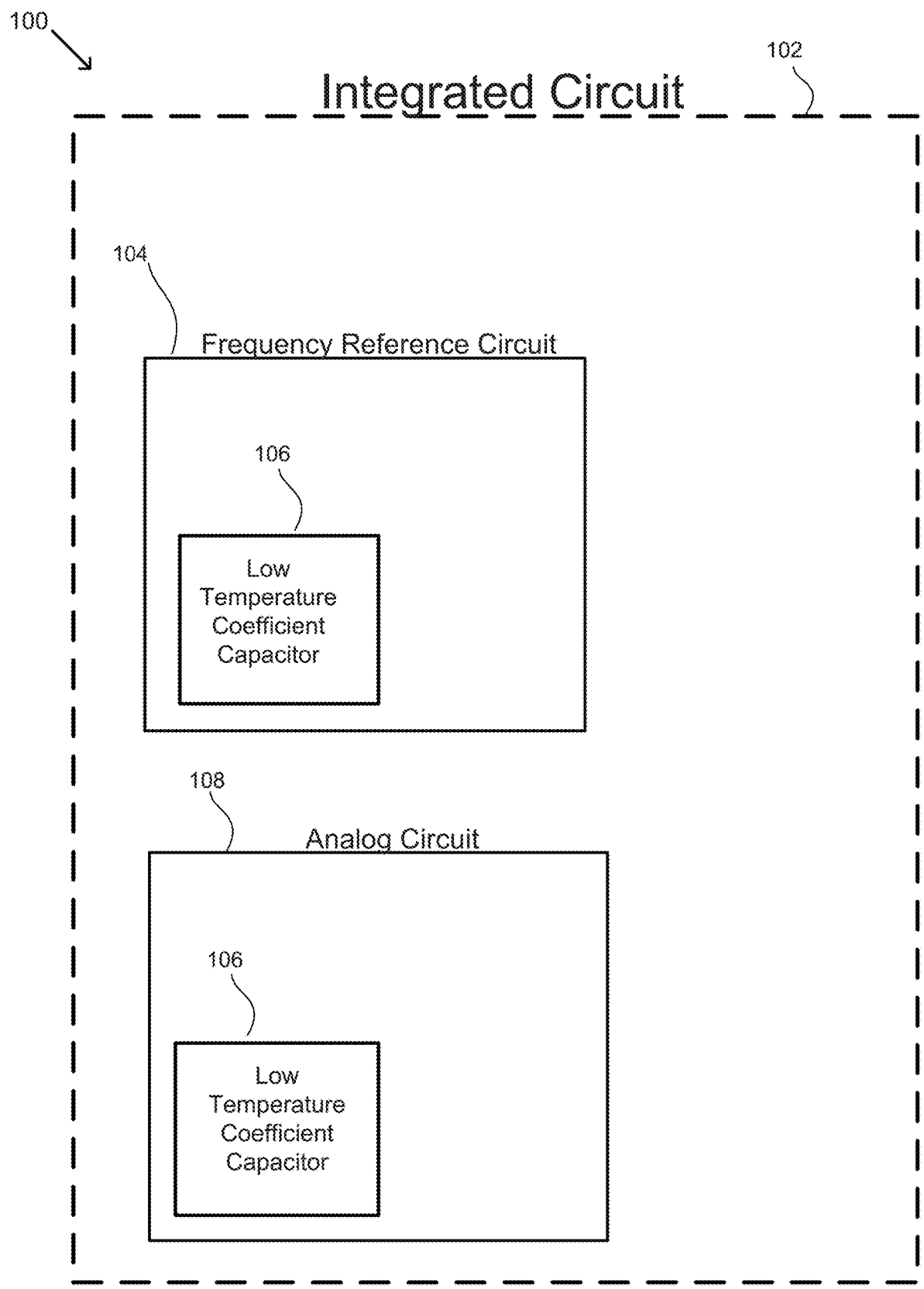
FIG. 1 conceptually illustrates a low temperature coefficient capacitor utilized within various circuits as part of an integrated circuit (IC) in accordance with an embodiment of the invention.

Low temperature coefficient capacitors can be utilized within an IC in various sub-circuits. A circuit diagram of an IC 102 in accordance with an embodiment of the invention is illustrated in FIG. 1. In the illustrated embodiment, a low temperature coefficient capacitor 106 can be utilized in various sub-circuits such as a frequency reference sub-circuit 104 and/or an analog sub-circuit 108. In many embodiments, implementations of low temperature coefficient capacitors can achieve significantly low temperature coefficients (e.g. 8.25 ppm/° C.).

Although various low temperature coefficient capacitor implementations are described above with reference to FIG. 1, any of a variety of low temperature coefficient capacitors may be utilized within ICs as appropriate to the requirements of specific applications in accordance with various embodiments of the invention. Commuted MOS capacitors are discussed further below.

Figure 2:
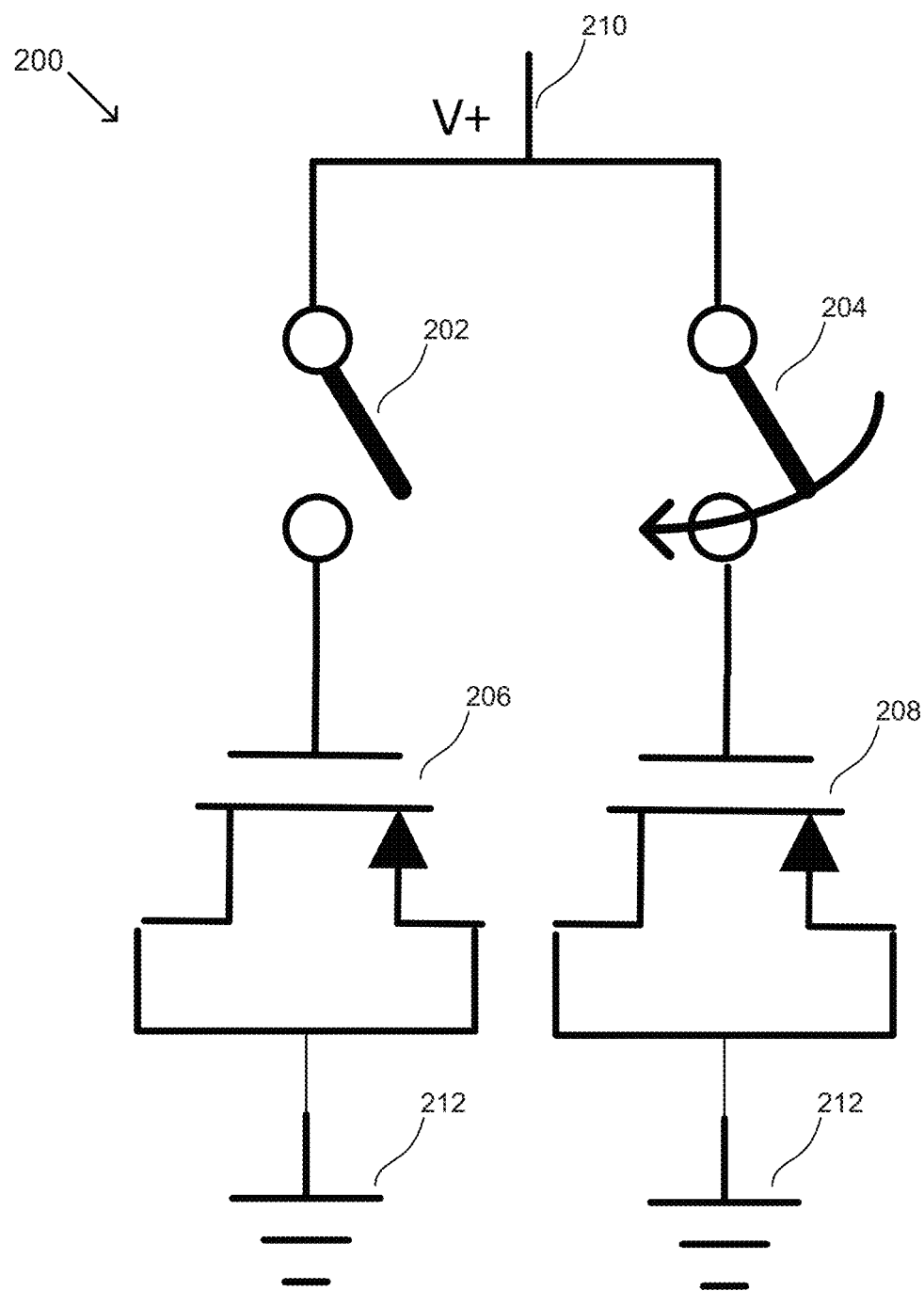
FIG. 2 is a circuit diagram of a low temperature coefficient capacitor utilizing two metal-oxide-semiconductor (MOS) capacitors in accordance with an embodiment of the invention.

In several embodiments, low temperature coefficient capacitors can include MOS transistors configured to act as a capacitor. A circuit diagram of a low temperature coefficient capacitor 200 in accordance with an embodiment of the invention is illustrated in FIG. 2. In the illustrated embodiment, MOS transistor 206 can have its source and drain terminals connected. Similarly, MOS transistor 208 can have its source and drain terminals connected. The gates of the MOS transistors 206 and 208 can be connected to power supply 210 through commuting switches 202 and 204, respectively. The source/drain terminals of MOS transistors 206 and 208 can be connected to a ground node 212. The commuting switches 202 and 204 can turn on/off interchangeably at a frequency f. In this way, one of the MOS transistors 206 or 208 is connected between the power supply 210 and ground 212 at any one time. The commuting switches 202 and 204 can be sized such that they do not add to the temperature coefficient of the overall circuit where the low temperature coefficient capacitor is utilized.

In certain embodiments, the low temperature coefficient capacitor can be utilized within a frequency reference circuit. In order to keep a loop offset of a frequency reference low, a voltage swing across the low temperature coefficient capacitor can be traded off with the loop offset. As a voltage swing across the low temperature coefficient capacitor is increased, it can lead to increased difference between a phase of an input reference signal to the frequency reference circuit and a phase of an output clock from the frequency reference circuit. The difference between the two phases is called loop offset and can increase with increasing voltage swing across the low temperature coefficient capacitor. Thus, in order to keep the loop offset of a frequency reference low, a voltage swing across the low temperature coefficient capacitor ideally would be kept low.

Although various low temperature coefficient capacitors implementations are described above with reference to FIG. 2, any of a variety of low temperature coefficient capacitors may be utilized as appropriate to the requirements of specific applications in accordance with various embodiments of the invention. Simulation results are discussed further below.

Figure 3:
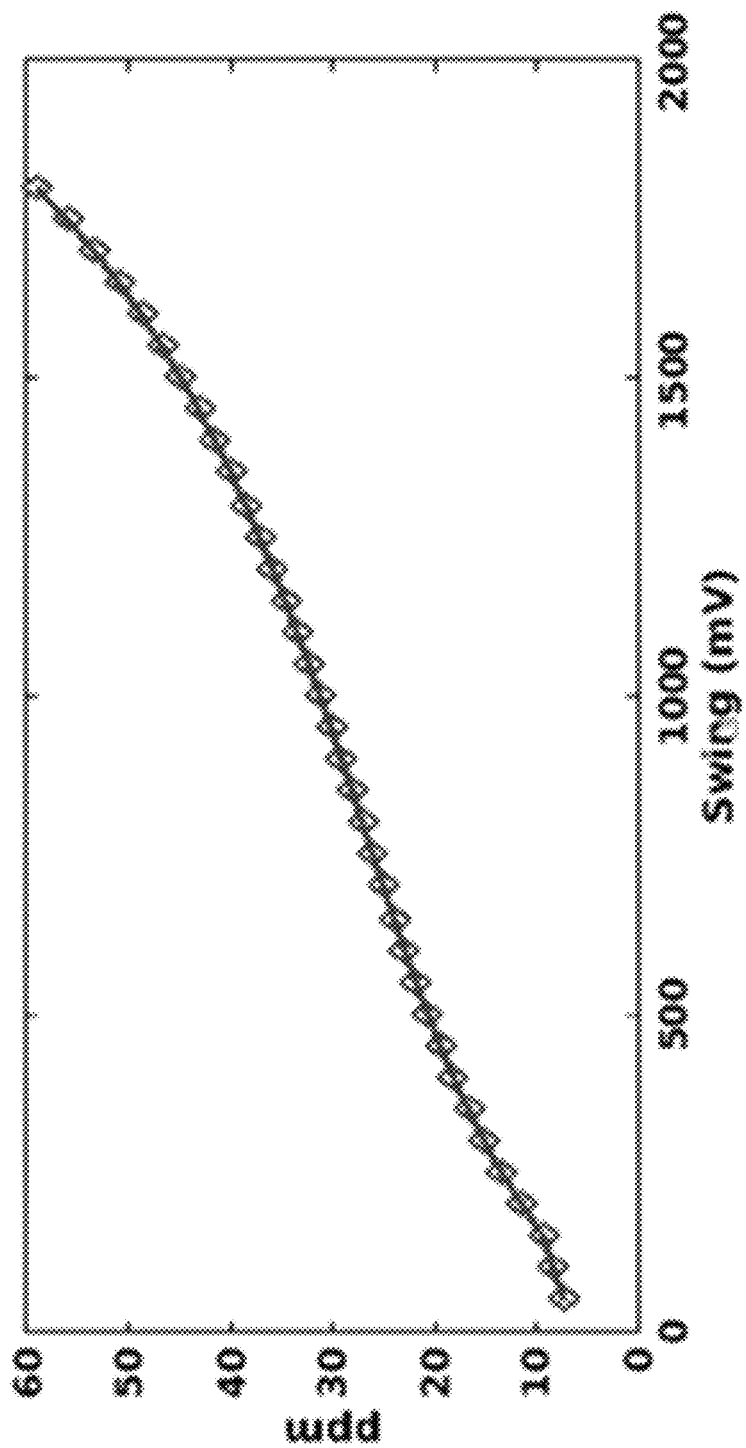
FIG. 3 shows simulated results of temperature coefficient for a low temperature coefficient capacitor as a function of voltage swing across the capacitor.

The temperature coefficient of a MOS capacitor in its accumulation region can depend on the voltage across the capacitor. In various embodiments, Cadence (Cadence Design Systems Inc, San Jose, CA) circuit simulator can be utilized to simulate the temperature coefficient of a low temperature coefficient capacitor. Cadence simulation results for a low temperature coefficient capacitor are shown in FIG. 3. As shown in FIG. 3, a temperature coefficient of the low temperature coefficient capacitor has been plotted as a function of a voltage swing across the capacitor. As can be seen in the illustrated plot, for voltage swings of less than 100 mV, the temperature coefficient can be as low as 8 ppm/° C. Note that the specific value for voltage swing and temperature coefficient can vary depending upon the low temperature coefficient capacitor and the requirements of specific applications.

While the above descriptions and associated figures have depicted low temperature coefficient capacitors, it should be clear that any of a variety of configurations for a low temperature coefficient capacitor can be implemented in accordance with embodiments of the invention. More generally, although the present invention has been described in certain specific aspects, many additional modifications and variations would be apparent to those skilled in the art. It is therefore to be understood that the present invention may be practiced otherwise than specifically described. Thus, embodiments of the present invention should be considered in all respects as illustrative and not restrictive.

What is claimed is:

1. A capacitor, comprising:
a plurality of metal-oxide-semiconductor (MOS) transistors, where each of the plurality of MOS transistors comprises a gate, a source and a drain terminal, and where the source and drain terminals of each of the plurality of MOS transistors are connected;
a plurality of switches, where each of the switches comprises two terminals;
wherein the plurality of switches are sized such that they do not add to the temperature coefficient of the overall circuit;
wherein first terminals of each of the switches from the plurality of switches are connected together; and
wherein a second terminal of each of the switches from the plurality of switches is connected to a gate terminal of each of the plurality of MOS transistors.

2. The capacitor of claim 1, wherein a signal generated by a voltage-controlled oscillator (VCO) is utilized to drive a first switch from the plurality of switches, while an inverse of the signal, generated by an inverter circuit, is utilized to drive a second switch from the plurality of switches.

3. The capacitor of claim 1, wherein the plurality of MOS transistors and the plurality of switches are configured, in combination, to simulate a capacitor that is stable with temperature variations.

4. The capacitor of claim 1, wherein each of the gates of the plurality of MOS transistors is connected to a power supply through a respective switch from the plurality of switches.

5. The capacitor of claim 4, wherein the source and drain terminals of the plurality of MOS transistors are connected to a ground node.

6. The capacitor of claim 5, wherein the plurality of switches are turned on/off interchangeably at a frequency f.

7. The capacitor of claim 6, wherein one of the MOS transistors from the plurality of MOS transistors is connected between the power supply and ground at any one time.

8. The capacitor of claim 1, wherein the capacitor is utilized within a frequency reference circuit.

9. The capacitor of claim 1, wherein the capacitor is utilized within an analog sub-circuit.

10. A capacitor, comprising:
   a plurality of metal-oxide-semiconductor (MOS) transistors, where each of the plurality of MOS transistors comprises a gate, a source and a drain terminal, and where the source and drain terminals of each of the plurality of MOS transistors are connected;
   a plurality of switches, where each of the switches comprises two terminals;
   at least two MOS capacitors that are commuted on/off to reduce a ripple in a voltage across the gate to source/drain of the MOS capacitors;
   wherein first terminals of each of the switches from the plurality of switches are connected together; and
   wherein a second terminal of each of the switches from the plurality of switches is connected to a gate terminal of each of the plurality of MOS transistors.

11. The capacitor of claim 10, wherein a signal generated by a voltage-controlled oscillator (VCO) is utilized to drive a first switch from the plurality of switches, while an inverse of the signal, generated by an inverter circuit, is utilized to drive a second switch from the plurality of switches.

12. The capacitor of claim 10, wherein the plurality of MOS transistors and the plurality of switches are configured, in combination, to simulate a capacitor that is stable with temperature variations.

13. The capacitor of claim 10, wherein each of the gates of the plurality of MOS transistors is connected to a power supply through a respective switch from the plurality of switches.

14. The capacitor of claim 13, wherein the source and drain terminals of the plurality of MOS transistors are connected to a ground node.

15. The capacitor of claim 14, wherein the plurality of switches are turned on/off interchangeably at a frequency f.

16. The capacitor of claim 15, wherein one of the MOS transistors from the plurality of MOS transistors is connected between the power supply and ground at any one time.

17. The capacitor of claim 10, wherein the plurality of switches are sized such that they do not add to the temperature coefficient of the overall circuit.

18. The capacitor of claim 10, wherein the capacitor is utilized within a frequency reference circuit.

19. The capacitor of claim 10, wherein the capacitor is utilized within an analog sub-circuit.

* * * * *